United States Patent
Huang et al.

(10) Patent No.: US 8,829,956 B2
(45) Date of Patent: Sep. 9, 2014

(54) SIGNAL GENERATING CIRCUITS FOR GENERATING FAN DRIVING SIGNAL

(71) Applicant: Delta Electronics, Inc., Taoyuan Hsien (TW)

(72) Inventors: Yueh-Lung Huang, Taoyuan Hsien (TW); Chin-Hsin Wu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 13/953,123

(22) Filed: Jul. 29, 2013

(65) Prior Publication Data

US 2014/0125383 A1 May 8, 2014

(30) Foreign Application Priority Data

Nov. 6, 2012 (CN) .......................... 2012 1 0438460

(51) Int. Cl.
*H03L 1/00* (2006.01)
*H03K 3/013* (2006.01)

(52) U.S. Cl.
CPC ..................................... *H03K 3/013* (2013.01)
USPC ........................... 327/141; 327/113; 327/198

(58) Field of Classification Search
CPC .......... H03K 3/02; H03K 3/027; H03K 5/08; H03K 5/082; H03K 5/084; H03K 17/041; H03K 17/0416; H03K 17/042
USPC .................. 327/142, 143, 198, 113, 355, 358
See application file for complete search history.

*Primary Examiner* — An Luu
(74) *Attorney, Agent, or Firm* — Muny, Geissler, Olds & Lowe, P.C.

(57) ABSTRACT

A signal generating circuit for generating a fan driving signal includes a phase adjusting circuit, a direct digital frequency synthesizer, a first operating circuit, a driving signal generator and a second operating circuit. The phase adjusting circuit receives a hall signal and adjusts a phase of the hall signal to generate a synchronization signal. The direct digital frequency synthesizer generates a modulating signal according to the synchronization signal. The first operating circuit receives a load current and generates a modulated signal according to the load current. The driving signal generator generates an original driving signal according to the synchronization signal. The second operating circuit generates a control signal according to the modulating signal and the modulated signal. The original driving signal is selectively outputted as the fan driving signal in response to the control signal.

14 Claims, 10 Drawing Sheets

US 8,829,956 B2

SIGNAL GENERATING CIRCUITS FOR GENERATING FAN DRIVING SIGNAL

CROSS REFERENCE TO RELATED APPLICATIONS

This Application claims priority of China Patent Application No. 201210438460.3, filed on Nov. 6, 2012, the entirety of which is incorporated by reference herein.

BACKGROUND OF THE INVENTION

1. Field of the Invention

The invention relates to a fan driving signal generating apparatus and a method, and more particularly, to a fan driving signal generating apparatus and a method for generating a fan driving signal which varies with load current.

2. Description of the Related Art

The heat dissipating problem of an electronic device is more and more important nowadays due to the increasing of the data processing information and the processing speed of the electronic device. In addition, the integrated process had become advanced so that more electronic elements can be contained in the same electronic device. Therefore, the heat dissipating function of an electronic device should be improved, accordingly.

Generally, a way of performing heat dissipation in an electronic device is to provide a fan inside of, or configured close to the electronic device, creating air convection so as to dissipate heat.

A Hall sensor is usually equipped in the fan for sensing the magnetic field change when the fan is spinning and therefore generating a corresponding Hall signal. The fan driving circuit generates the driving signal according to the Hall signal. However, since the placement of the Hall sensor is usually fixed, for different operating conditions and environments, the driving signal cannot always drive the fan to achieve an optimum performance. The optimum performance may be, for example, the fan generates little noise or vibrations.

Therefore, a fan driving signal generating apparatus and method for generating a fan driving signal which varies with load current so as to achieve an optimum performance is highly required.

BRIEF SUMMARY OF THE INVENTION

Signal generating circuits are provided. An exemplary embodiment of a signal generating circuit for generating a fan driving signal comprises a phase adjusting circuit, a direct digital frequency synthesizer, a first operating circuit, a driving signal generator and a second operating circuit. The phase adjusting circuit receives a hall signal and adjusts a phase of the hall signal to generate a synchronization signal. The direct digital frequency synthesizer generates a modulating signal according to the synchronization signal. The first operating circuit receives a load current and generates a modulated signal according to the load current. The driving signal generator generates an original driving signal according to the synchronization signal. The second operating circuit generates a control signal according to the modulating signal and the modulated signal. The original driving signal is selectively outputted as the fan driving signal in response to the control signal.

Another exemplary embodiment of a signal generating circuit coupled to a fan driving circuit for generating a fan driving signal such that the fan driving circuit drives a fan according to the fan driving signal comprises a phase adjusting circuit, a direct digital frequency synthesizer, a first operating circuit, a driving signal generator and a second operating circuit. The phase adjusting circuit receives a hall signal from the fan driving circuit and adjusts a phase of the hall signal to generate a synchronization signal. The direct digital frequency synthesizer is coupled to the phase adjusting circuit and generates a modulating signal according to the synchronization signal. The first operating circuit receives a load current from the fan driving circuit and generates a modulated signal according to the load current. The load circuit reflects a current operation of the fan. The driving signal generator is coupled to the phase adjusting circuit and generates an original driving signal according to the synchronization signal. The second operating circuit is coupled to the first operating circuit, the direct digital frequency synthesizer and the driving signal generator and generates a control signal according to the modulating signal and the modulated signal. The original driving signal comprises a plurality of first pulses, and the fan driving signal comprises a plurality of second pulses, and the first pulses have fixed widths and widths of the second pulses vary with a voltage level of the control signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
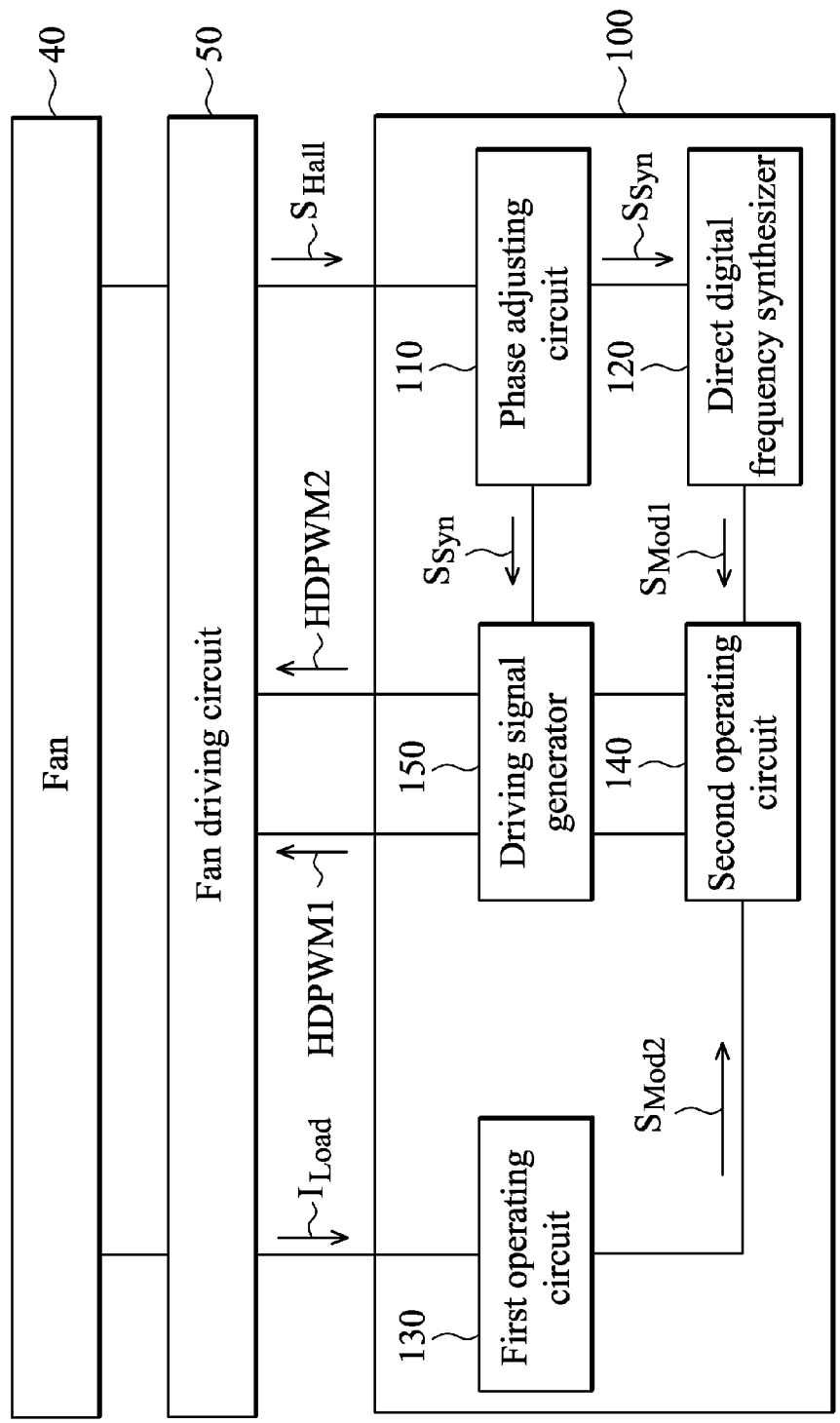
FIG. 1 shows a block diagram of a signal generating circuit according to an embodiment of the present invention.

FIG. 1 shows a block diagram of a signal generating circuit according to an embodiment of the present invention. The signal generating circuit 100 is coupled to a fan driving circuit 50 for generating fan driving signals HDPWM1 and HDPWM2, such that the fan driving circuit 50 may drive a fan 40 according to the fan driving signals HDPWM1 and HDPWM2. The fan driving signals HDPWM1 and HDPWM2 are respectively provided when the fan spins in different directions in response to the coil current. Since the waveforms of the fan driving signals HDPWM1 and HDPWM2 are symmetric, for brevity, only one of the fan driving signals are illustrated in the following embodiment.

According to an embodiment of the present invention, the signal generating circuit 100 may comprise a phase adjusting circuit 110, a direct digital frequency synthesizer 120, a first operating circuit 130, a second operating circuit 140 and a driving signal generator 150. The phase adjusting circuit 110 receives a Hall signal $S_{Hall}$ generated by a Hall device (such as a Hall sensor, not shown in the figure) from the fan driving circuit 50, and adjusts a phase of the hall signal to generate a synchronization signal $S_{Syn}$.

The direct digital frequency synthesizer 120 is coupled to the phase adjusting circuit 110 and generates a modulating signal $S_{Mod1}$ according to the synchronization signal $S_{Syn}$. The first operating circuit 130 receives load current $I_{Load}$ from the fan driving circuit 50 and generates a modulated signal $S_{Mod2}$ according to the load current $I_{Load}$, wherein the load circuit $I_{Load}$ reflects a current operation of the fan 40. Note that the load circuit $I_{Load}$ may be derived based on a voltage at an internal node of the fan driving circuit 50 or a voltage drop caused by a current flowing through a load (not shown). Therefore, the invention should not be limited to any specific way of implementation.

The driving signal generator 150 is coupled to the phase adjusting circuit 110 and generates an original driving signal according to the synchronization signal $S_{Syn}$. According to an embodiment of the present invention, the original driving signal may be a Pulse Width Modulation (PWM) signal comprising a plurality of pulses. When the fan speed is fixed, the pulses in the original driving signal generated by the driving signal generator 150 have fixed widths (or, fixed duty cycle). When the fan speed changes, the widths or duty cycles of the pulses in the original driving signal generated by the driving signal generator 150 are accordingly adjusted according to the fan speed requirements.

The second operating circuit 140 is coupled to the first operating circuit 130, the direct digital frequency synthesizer 120 and the driving signal generator 150 and generates a control signal $S_{Ctrl}$ according to the modulating signal $S_{Mod1}$ and the modulated signal $S_{Mod2}$. According to an embodiment of the present invention, the signal generating circuit 100 may selectively output the original driving signal as the fan driving signals HDPWM1 and HDPWM2 according to the control signal $S_{Ctrl}$). Therefore, in response to the change in the voltage level of the control signal $S_{Ctrl}$, although the original driving signal has a fixed pulse width when the fan speed is fixed, the pulse width of the resulting fan driving signals HDPWM1 and HDPWM2 may vary with time (as the waveform of signal $S_{HDPWM}$ shown in FIG. 9). Thus, the operations of the fan 40 may have an optimum performance (for example, the fan generates little noise or vibrations, or others). Each element in the signal generating circuit 100 will further be discussed in more detail in the following paragraph.

According to an embodiment of the present invention, the phase adjusting circuit 110 may detect a span of a time interval TH for the hall signal $S_{Hall}$ having a high voltage level and a span of a time interval TL for the hall signal $S_{Hall}$ having a low voltage level. For example, the phase adjusting circuit 110 may comprise two counters for counting the number of times that the hall signal $S_{Hall}$ has a high and low voltage level per unit time under a predetermined sampling frequency, thereby deriving the spans of the time intervals TH and TL. After obtaining the spans of the time intervals TH and TL, the phase adjusting circuit 110 may estimate the current fan speed of the fan 40.

For example, the fan speed may be estimated according to a frequency of the hall signal $S_{Hall}$ and the spans of the time intervals TH and TL. After obtaining information regarding the fan speed, the phase adjusting circuit 110 may further determine an electrical degrees X according to the information. According to an embodiment of the present invention, a mapping relationship between the electrical degrees X and the fan speed may be pre-stored in an internal memory device (not shown). For example, a mapping relationship between the electrical degrees X and the fan speed may be stored in a Look Up Table (LUT), and the system designer may find out the best correspondence between the electrical degrees X and the fan speed based on experiment results. After obtaining the electrical degrees X, the phase adjusting circuit 110 may adjusts the phase of the hall signal $S_{Hall}$ according to the electrical degrees X to generate the synchronization signal $S_{Syn}$.

Figure 2:
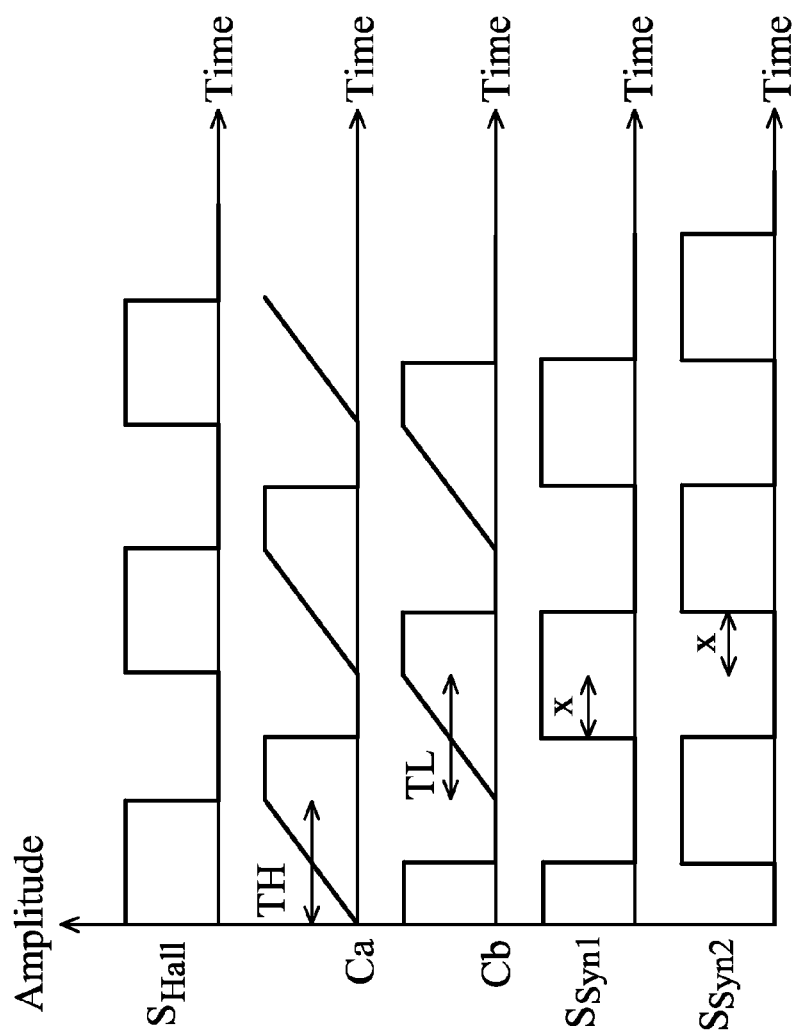
FIG. 2 shows exemplary signal waveforms according to an embodiment of the present invention.

FIG. 2 shows exemplary signal waveforms according to an embodiment of present the invention. Ca and Cb represent the counting results of the counters, for obtaining information regarding the spans of the time intervals TH and TL. After obtaining the electrical degrees X, the phase on the hall signal $S_{Hall}$ may further be adjusted in two different ways: a phase-lead adjustment and a phase-lag adjustment. For example, the synchronization signal $S_{Syn1}$ may be a result of phase-lead adjusting (or, advancing) the hall signal $S_{Hall}$ by X degrees, and the synchronization signal $S_{Syn2}$ may be a result of phase-lag adjusting (or, lagging) the hall signal $S_{Hall}$ by X degrees, wherein the relationships (or correspondence) between the phase-lead and/or phase-lag adjusting by X degrees versus the fan speed may also be pre-stored in the internal memory device.

After obtaining the synchronization signal $S_{Syn}$, the direct digital frequency synthesizer 120 may further generate the modulating signal $S_{Mod1}$ according to the synchronization signal $S_{Syn}$.

Figure 3:
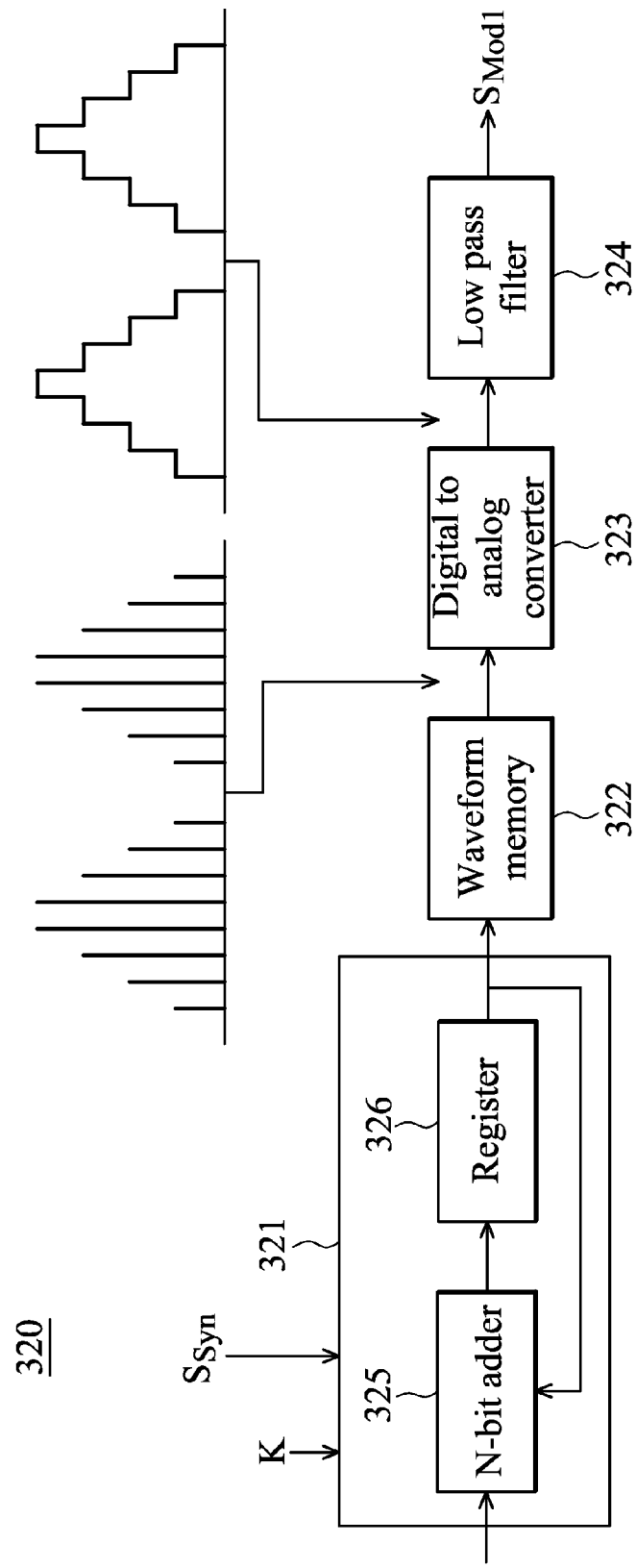
FIG. 3 shows an exemplary block diagram of a direct digital frequency synthesizer according to an embodiment of the present invention.

FIG. 3 shows an exemplary block diagram of a direct digital frequency synthesizer according to an embodiment of the present invention. The direct digital frequency synthesizer may comprise a waveform accumulator 321, a waveform memory 322, a digital to analog converter 323 and a low pass filter 324. According to an embodiment of the present invention, the waveform accumulator 321 may further comprise an N-bit adder 325 and a register 326.

Figure 4A:
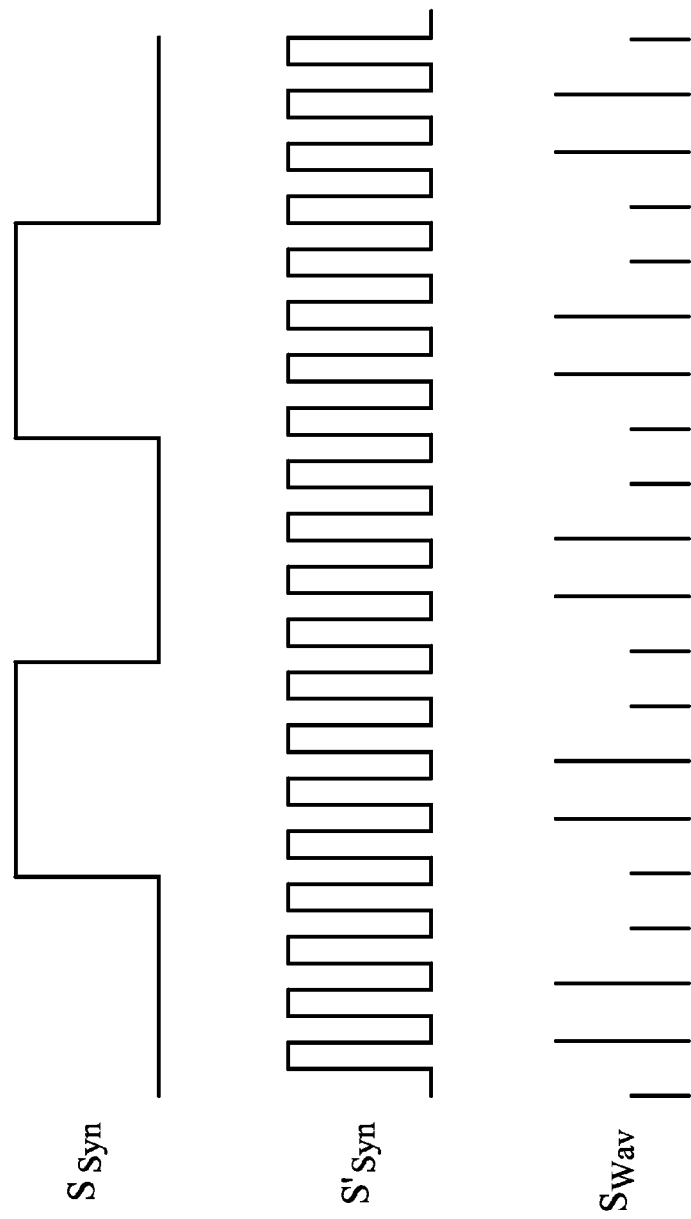
FIG. 4A shows exemplary signal waveforms according to an embodiment of the present invention.

FIG. 4A shows exemplary signal waveforms according to an embodiment of the present invention. According to an embodiment of the present invention, the waveform accumulator 321 may receive the synchronization signal $S_{Syn}$ and a predetermined value k. After receiving the synchronization signal $S_{Syn}$, the waveform accumulator 321 may take the synchronization signal $S_{Syn}$ as a basic signal and double a frequency of the synchronization signal $S_{Syn}$ via software so as generate the double-frequency synchronization signal $S'_{Syn}$ as shown in FIG. 4A. Next, the waveform accumulator 321 may take the value k as an initial count value, and count the occurrence time of the pulses (or, the rising/falling edges) of the double-frequency synchronization signal $S'_{Syn}$ based on the initial count value k. According to a concept of the invention, the direct digital frequency synthesizer may generate the modulating signal $S_{Mod1}$ according to the phase change of the synchronization signal $S_{Syn}$.

For example, every time when a pulse (or, a rising/falling edge) of the double-frequency synchronization signal $S'_{Syn}$ occurs, the N-bit adder 325 accumulates the count value (which is initially set to the value k) by one, and stores the accumulated count value in the register 326. Note that every time when the accumulated count value overflows, the count value of the N-bit adder 325 is reset and the count value stored in the register 326 is outputted as a sampling address of the waveform memory 322. Therefore, the waveform memory 322 may output a corresponding waveform signal $S_{Wav}$ based on the count value.

Referring back to FIG. 3, the digital to analog converter 323 may further convert the waveform signal $S_{Wav}$ into an analog signal. Finally, the low pass filter 324 may filter the converted (i.e. analog) waveform signal $S_{wav}$ to generate the modulating signal $S_{Mod1}$. Note that in the embodiments of the invention, the modulating signal $S_{Mod1}$ may reflect the desired current to be outputted by the system.

Figure 4B:
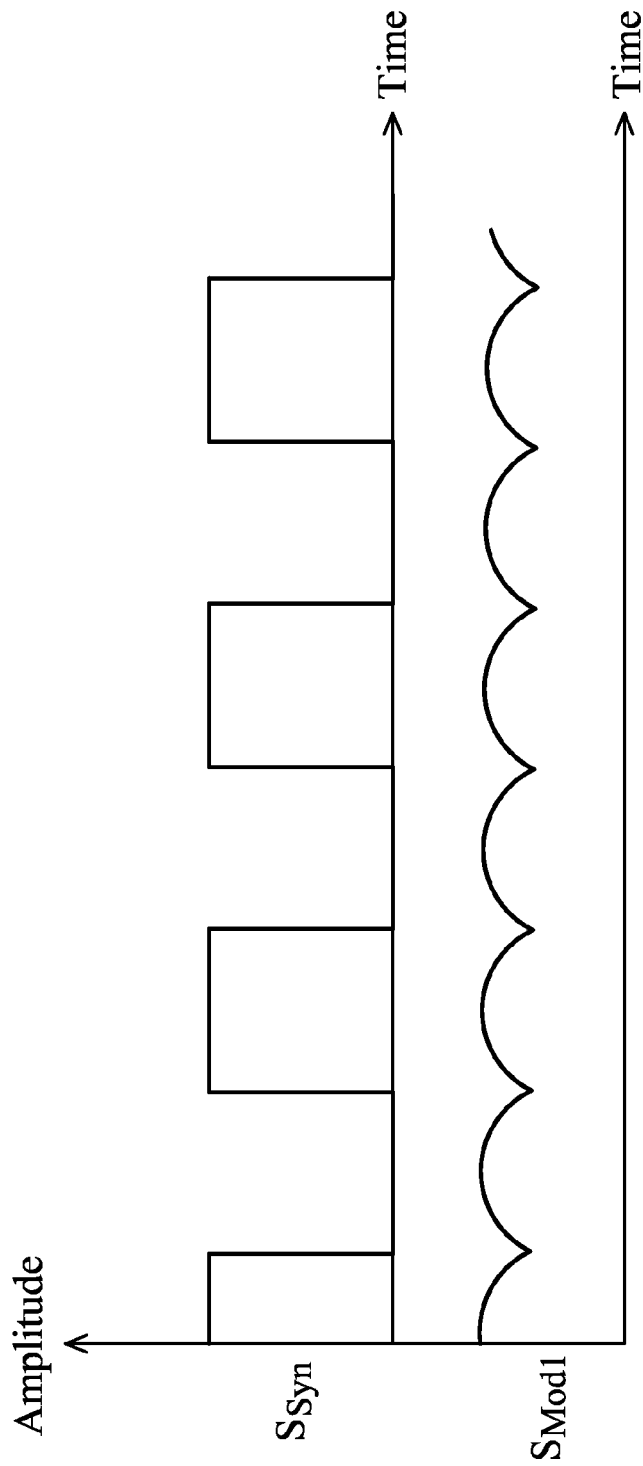
FIG. 4B shows exemplary signal waveforms according to an embodiment of the present invention.

FIG. 4B shows exemplary signal waveforms according to an embodiment of the present invention. In the embodiment, the modulating signal $S_{Mod1}$ may be generated according to the synchronization signal $S_{Syn}$, and the waveform of a basic sine wave stored in the waveform memory 322. Note that the waveforms stored in the waveform memory 322 as the fundamental waveforms for generating the modulating signal $S_{Mod1}$ are not limited to basic sine waves, and may also be the waveforms of basic triangle waves, basic square waves, or any other signals. Therefore, based on different system requirements, the modulating signal $S_{Mod1}$ may also be generated according to the synchronization signal $S_{Syn}$ and the waveform of other basic waves stored in the waveform memory 322, and the invention should not be limited to the waveforms shown in FIG. 4A and FIG. 4B.

Figure 5:
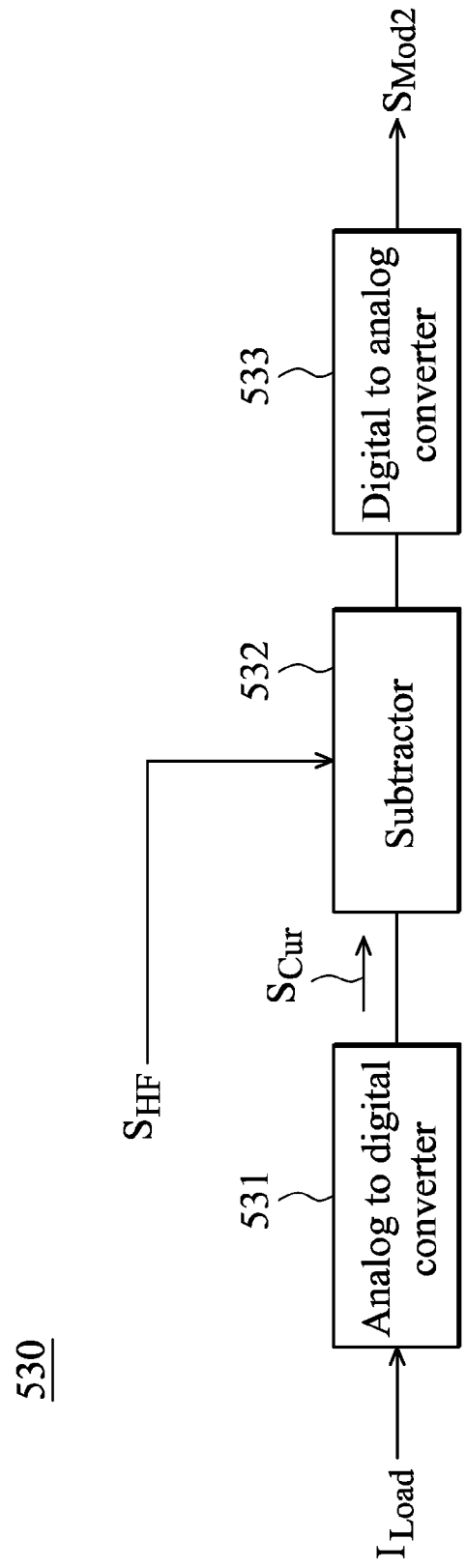
FIG. 5 shows an exemplary block diagram of the first operating circuit according to an embodiment of the present invention.

FIG. 5 shows an exemplary block diagram of the first operating circuit according to an embodiment of the present invention. The first operating circuit 530 may comprise an analog to digital converter 531, a subtractor 532 and a digital to analog converter 533. The analog to digital converter 531 converts load current $I_{Load}$ (which may be an analog signal) into a digital current signal $S_{Cur}$. The first operating circuit 530 may further receive a high frequency signal $S_{HF}$ from the driving signal generator 150 and subtract the current signal $S_{Cur}$ from the high frequency signal $S_{HF}$ via the subtracter 532 to generate the modulated signal $S_{Mod2}$. According to an embodiment of the present invention, a frequency of the high frequency signal $S_{HF}$ relates to a frequency of the original driving signal. For example, the frequency of the high frequency signal $S_{HF}$ may be the same as the frequency of the original driving signal (for example, a PWM signal).

Figure 6:
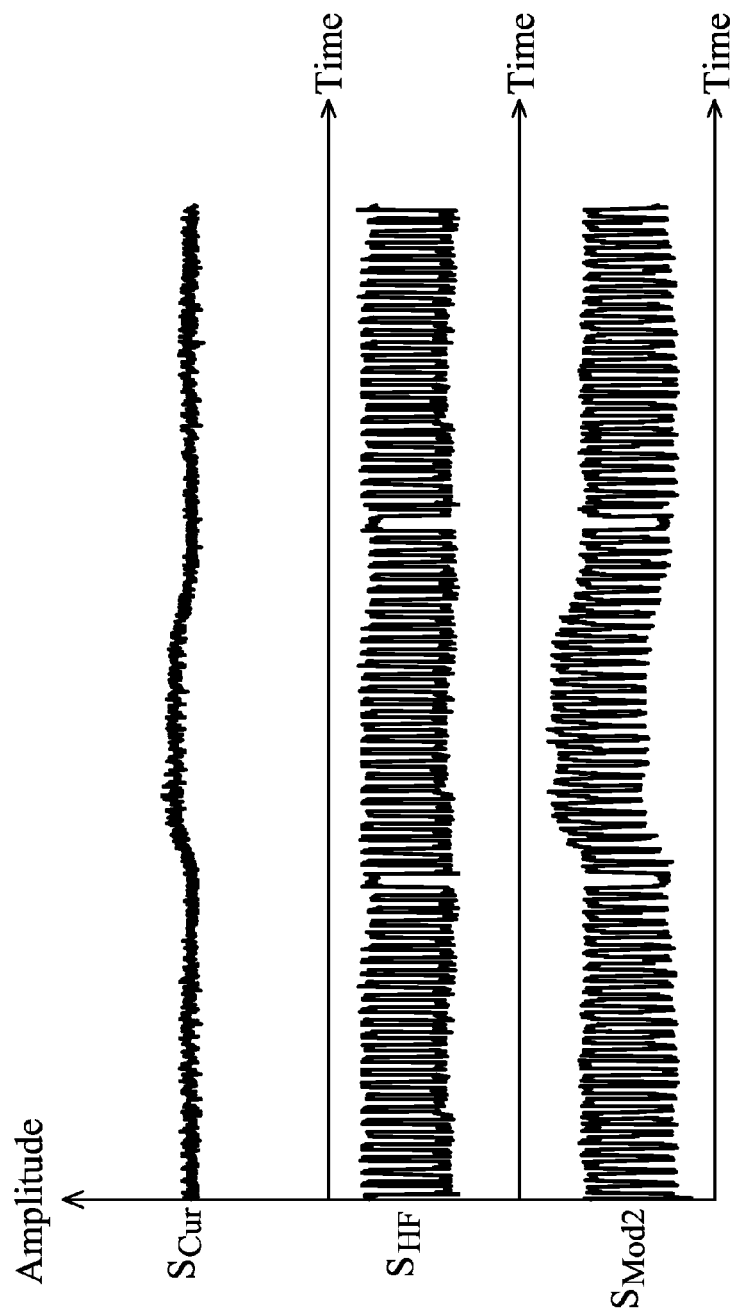
FIG. 6 shows exemplary signal waveforms according to an embodiment of the present invention.

FIG. 6 shows exemplary signal waveforms according to an embodiment of the present invention. The operation of subtracting the current signal $S_{Cur}$ from the high frequency signal $S_{HF}$ is equivalent to carry the change in the current signal $S_{Cur}$ onto the high frequency signal $S_{HF}$, thereby generating another high frequency control signal (that is, the modulated signal $S_{Mod2}$) which varies with load current change.

Figure 7:
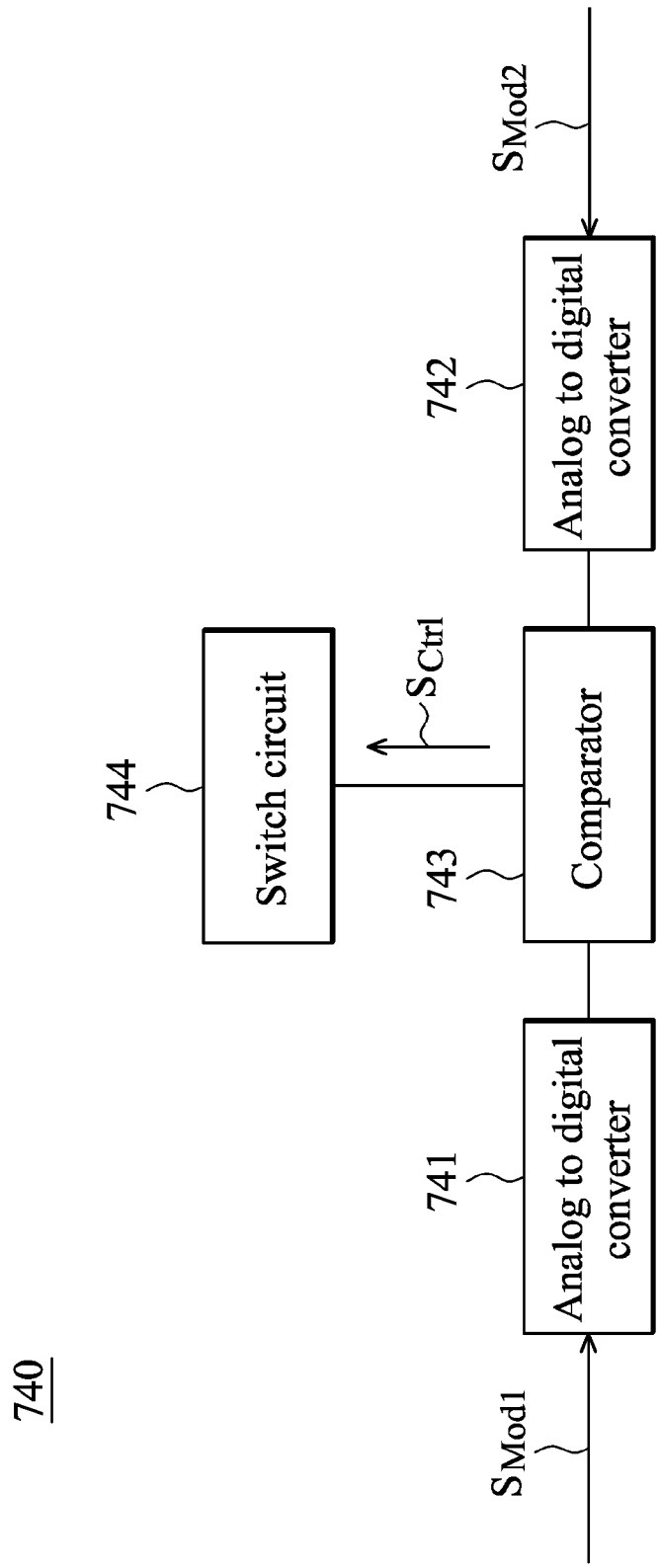
FIG. 7 shows an exemplary block diagram of the second operating circuit according to an embodiment of the present invention.

FIG. 7 shows an exemplary block diagram of the second operating circuit according to an embodiment of the present invention. The second operating circuit 740 may comprise analog to digital converters 741 and 742, a comparator 743 and a switch circuit 744. The analog to digital converters 741 and 742 may respectively convert the analog modulating signal $S_{Mod}$ and modulated signal $S_{Mod2}$ into digital signals. Note that according to another embodiment of the present invention, the digital to analog converter 533 as shown in FIG. 5 and the analog to digital converter 742 as shown in FIG. 7 may both be omitted. In other words, the first operating circuit may directly output the analog modulated signal $S_{Mod2}$ to the second operating circuit.

The comparator 743 compares levels the modulated signal $S_{Mod2}$ and the modulating signal $S_{Mod1}$ to generate the control signal $S_{Ctrl}$. According to an embodiment of the present invention, when a level of the modulating signal $S_{Mod1}$ is greater than a level of the modulated signal $S_{Mod2}$, the control signal $S_{Ctrl}$ has a first voltage level, and when the level of the modulating signal $S_{Mod1}$ is not greater than the level of the modulated signal $S_{Mod2}$, the control signal $S_{Ctrl}$ has a second voltage level.

The switch circuit 744 may receive the control signal $S_{Ctrl}$) and may be coupled to the driving signal generator 150 for changing the output of the driving signal generator 150 in response to the control signal $S_{Ctrl}$. According to an embodiment of the present invention, for example, when the control signal $S_{Ctrl}$ has a first voltage level, the original driving signal generated based on the synchronization signal $S_{Syn}$ by the driving signal generator is outputted as the fan driving signal HDPWM1 or HDPWM2 (note that in the following paragraphs, the fan driving signal $S_{HDPWM}$ is used to represent any of the HDPWM1 and HDPWM2). When the control signal has the second voltage level, the original driving signal is not outputted such that the amplitude of the fan driving signal $S_{HDPWM}$ is zero.

Figure 8:
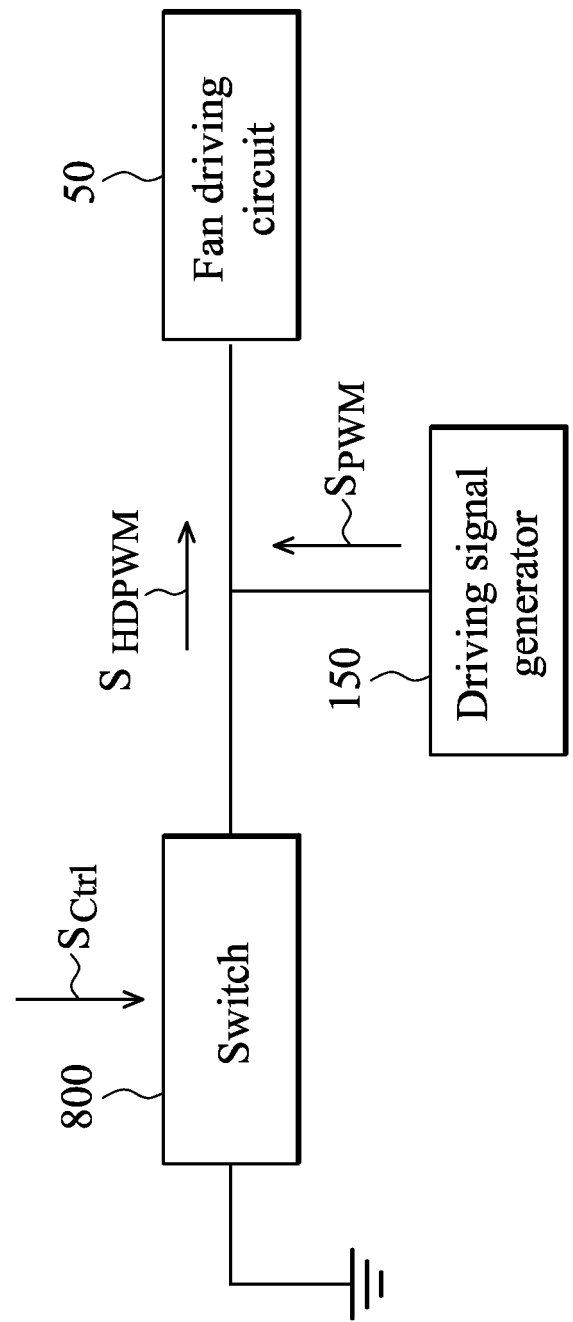
FIG. 8 is an exemplary diagram showing a concept of generating the fan driving signal according to the control signal $S_{Ctrl}$ according to an embodiment of the present invention.

FIG. 8 is an exemplary diagram showing a concept of generating the fan driving signal according to the control signal $S_{Ctrl}$ according to an embodiment of the present invention. The switch circuit 744 may comprise one or more switches (for example, the switch 800 as shown). The switch 800 may be coupled to the fan driving circuit 50 and the driving signal generator 150. When the control signal $S_{Ctrl}$ has a first voltage level, the switch 800 will not be turned on. Thus, the original driving signal $S_{PWM}$ generated based on the synchronization signal $S_{Syn}$ by the driving signal generator 150 is outputted as the fan driving signal $S_{HDPWM}$. When the control signal $S_{Ctrl}$ has the second voltage level, the switch 800 will be turned on. Thus, an amplitude of the fan driving signal $S_{HDPWM}$ is pulled down to zero (that is, the ground voltage) via the path conducted by the switch 800.

Figure 9:
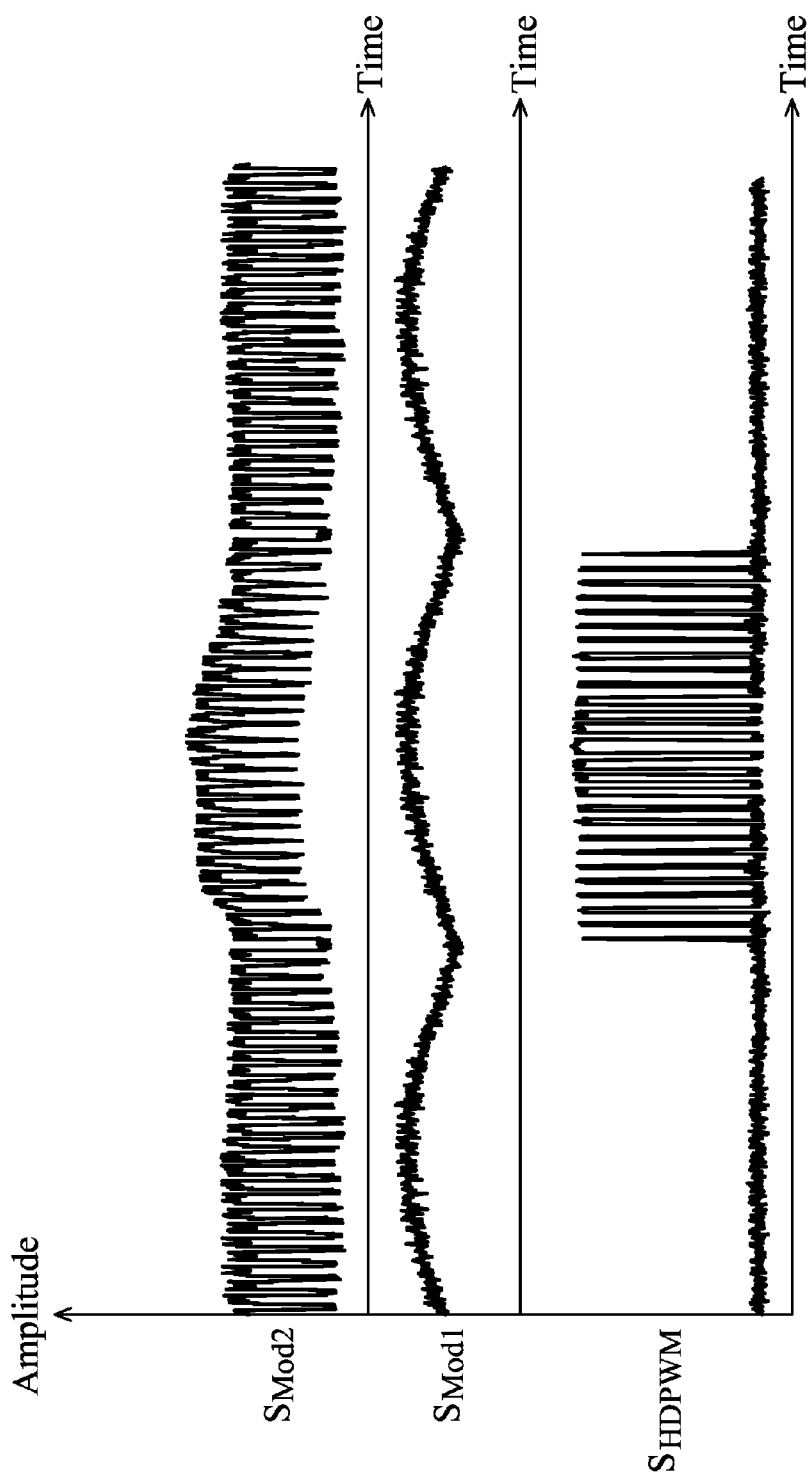
FIG. 9 shows exemplary signal waveforms according to an embodiment of the present invention.

FIG. 9 shows exemplary signal waveforms according to an embodiment of the present invention. As shown, since the modulated signal $S_{Mod2}$ is a high frequency signal with amplitude rapidly changed between high and low voltage levels, a portion of the amplitude in each pulse of the original driving signal $S_{PWM}$ may be pulled down to zero according to the control signal $S_{Ctrl}$. Therefore, when the fan speed requirement remains unchanged, although the original driving signal $S_{PWM}$ has a fixed pulse width, the pulse widths of the resulting fan driving signal $S_{HDPWM}$ are changed with time. The way of changing the pulse widths of the resulting fan driving signal $S_{HDPWM}$ may be implemented by generating the corresponding modulating signal $S_{Mod1}$ via the direct digital frequency synthesizer based on the system requirement, so as to facilitate the fan 40 to have an optimum performance.

The above-described embodiments of the present invention can be implemented in any of numerous ways. For example, the embodiments may be implemented using hardware, software or a combination thereof. It should be appreciated that any component or collection of components that perform the functions described above can be generically considered as one or more processors that control the above discussed function. The one or more processors can be implemented in numerous ways, such as with dedicated hardware, or with general purpose hardware that is programmed using microcode or software to perform the functions recited above.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A signal generating circuit for generating a fan driving signal, the signal generating circuit comprising:
    a phase adjusting circuit, receiving a hall signal and adjusting a phase of the hall signal to generate a synchronization signal;
    a direct digital frequency synthesizer, coupled to the phase adjusting circuit and generating a modulating signal according to the synchronization signal;
    a first operating circuit, receiving a load current and generating a modulated signal according to the load current;
    a driving signal generator, coupled to the phase adjusting circuit and generating an original driving signal according to the synchronization signal; and
    a second operating circuit, coupled to the first operating circuit, the direct digital frequency synthesizer and the driving signal generator and generating a control signal according to the modulating signal and the modulated signal,
    wherein the original driving signal is selectively outputted as the fan driving signal in response to the control signal.

2. The signal generating circuit as claimed in claim 1, wherein the phase adjusting circuit detects a span of a first time interval for the hall signal having a high voltage level and a span of a second time interval for the hall signal having a low voltage level, and determines an electrical degree according to the span of the first time interval and the span of the second time interval, and adjusts the phase of the hall signal according to the electrical degree to generate the synchronization signal.

3. The signal generating circuit as claimed in claim 1, wherein the direct digital frequency synthesizer generates the modulating signal according to a phase change of the synchronization signal.

4. The signal generating circuit as claimed in claim 1, wherein the first operating circuit further receives a high frequency signal from the driving signal generator, generates a current signal according to the load current and subtracts the current signal from the high frequency signal to generate the modulated signal.

5. The signal generating circuit as claimed in claim 4, wherein a frequency of the high frequency signal relates to a frequency of the original driving signal.

6. The signal generating circuit as claimed in claim 1, wherein the second operating circuit compares levels the modulated signal and the modulating signal to generate the control signal, and when the level of the modulating signal is greater than the level of the modulated signal, the control signal has a first voltage level, and when the level of the modulating signal is not greater than the level of the modulated signal, the control signal has a second voltage level.

7. The signal generating circuit as claimed in claim 6, wherein when the control signal has the first voltage level, the original driving signal is outputted as the fan driving signal, and when the control signal has the second voltage level, the original driving signal is not outputted such that an amplitude of the fan driving signal is zero.

8. A signal generating circuit coupled to a fan driving circuit for generating a fan driving signal such that the fan driving circuit drives a fan according to the fan driving signal, the signal generating circuit comprising:
    a phase adjusting circuit, receiving a hall signal from the fan driving circuit and adjusting a phase of the hall signal to generate a synchronization signal;
    a direct digital frequency synthesizer, coupled to the phase adjusting circuit and generating a modulating signal according to the synchronization signal;
    a first operating circuit, receiving a load current from the fan driving circuit and generating a modulated signal according to the load current, wherein the load circuit reflects a current operation of the fan;
    a driving signal generator, coupled to the phase adjusting circuit and generating an original driving signal according to the synchronization signal; and
    a second operating circuit, coupled to the first operating circuit, the direct digital frequency synthesizer and the driving signal generator and generating a control signal according to the modulating signal and the modulated signal,
    wherein the original driving signal comprises a plurality of first pulses, and the fan driving signal comprises a plurality of second pulses, and the first pulses have fixed widths and widths of the second pulses vary with a voltage level of the control signal.

9. The signal generating circuit as claimed in claim 8, wherein the phase adjusting circuit comprises a first counter counting a span of a first time interval for the hall signal having a high voltage level and a second counter counting a span of a second time interval for the hall signal having a low voltage level, and the phase adjusting circuit determines an electrical degree according to the span of the first time interval and the span of the second time interval, and adjusts the phase of the hall signal according to the electrical degree to generate the synchronization signal.

10. The signal generating circuit as claimed in claim 8, wherein the direct digital frequency synthesizer comprises:
    an adder, accumulating a count value according to a phase change of the synchronization signal;
    a register, coupled to the adder for registering and outputting the count value;
    a waveform memory, generating a waveform signal according to the count value;
    a digital to analog converter, converting the waveform signal; and
    a low pass filter, filtering the converted waveform signal to generate the modulating signal.

11. The signal generating circuit as claimed in claim 8, wherein the first operating circuit comprises:
    an analog to digital converter, converting the load current into a current signal; and
    a subtracter, subtracting the current signal from the high frequency signal to generate the modulated signal.

12. The signal generating circuit as claimed in claim 8, wherein a frequency of the high frequency signal relates to a frequency of the original driving signal.

13. The signal generating circuit as claimed in claim 8, wherein the second operating circuit comprises:

a comparator, comparing levels the modulated signal and the modulating signal to generate the control signal, wherein when the level of the modulating signal is greater than the level of the modulated signal, the control signal has a first voltage level, and when the level of the modulating signal is not greater than the level of the modulated signal, the control signal has a second voltage level.

14. The signal generating circuit as claimed in claim 13, wherein when the control signal has the first voltage level, the original driving signal is outputted as the fan driving signal, and when the control signal has the second voltage level, the original driving signal is not outputted such that an amplitude of the fan driving signal is zero.

* * * * *